(12) United States Patent
Bin Abu Bakar et al.

(10) Patent No.: US 11,127,878 B2
(45) Date of Patent: Sep. 21, 2021

(54) METHOD OF DEPOSITING GALLIUM NITRIDE ON A SUBSTRATE

(71) Applicant: Universiti Malaya, Kuala Lumpur (MY)

(72) Inventors: Ahmad Shuhaimi Bin Abu Bakar, Kuala Lumpur (MY); Mohd Adreen Shah Bin Azman Shah, Kuala Lumpur (MY)

(73) Assignee: Universiti Malaya, Kuala Lumpur (MY)

( * ) Notice: Subject to any disclaimer, the term of this patent is extended or adjusted under 35 U.S.C. 154(b) by 31 days.

(21) Appl. No.: 16/713,551

(22) Filed: Dec. 13, 2019

(65) Prior Publication Data

US 2020/0411714 A1  Dec. 31, 2020

(30) Foreign Application Priority Data

Nov. 30, 2018  (MY) .......................... PI 2018002272

(51) Int. Cl.
```
H01L 33/00      (2010.01)
H01L 33/12      (2010.01)
C30B 29/40      (2006.01)
H01L 33/22      (2010.01)
C30B 25/18      (2006.01)
H01L 33/32      (2010.01)
```

(52) U.S. Cl.
CPC .......... *H01L 33/007* (2013.01); *C30B 25/183* (2013.01); *C30B 29/406* (2013.01); *H01L 33/12* (2013.01); *H01L 33/22* (2013.01); *H01L 33/32* (2013.01)

(58) Field of Classification Search
None
See application file for complete search history.

(56) References Cited

U.S. PATENT DOCUMENTS

| | | | | |
|---|---|---|---|---|
| 8,471,265 B2* | 6/2013 | Miyoshi | ................ | C30B 25/186 257/76 |
| 9,711,685 B2* | 7/2017 | Sako | ....................... | C30B 33/10 |
| 2009/0114933 A1* | 5/2009 | Osawa | .................... | H01L 33/22 257/96 |

OTHER PUBLICATIONS

"Analysis of the growth of GaN epitaxy on silicon" Zhao et al Journal of Semiconductors pp. 033006-1 (Year: 2018).*

* cited by examiner

*Primary Examiner* — Bradley Smith
(74) *Attorney, Agent, or Firm* — Preston Smirman; Smirman IP Law, PLLC

(57) ABSTRACT

A method of depositing a coating layer comprising gallium nitride on a substrate comprising the steps of: (a) providing the substrate having a plurality of side walls and valleys; (b) forming a first layer of gallium nitride deposited on the substrate, by reacting gaseous trimethylgallium and ammonia at a temperature ranging from 400 to 500° C., such that the first layer is formed on the side walls and the valleys; and (c) forming a second layer of gallium nitride deposited on top of the first layer, by reacting gaseous trimethylgallium and ammonia at a temperature ranging from 1000 to 1200° C., to obtain the coating layer comprising the first layer of gallium nitride and the second layer of gallium nitride at a thickness ranging from 3.0 to 4.5 μm.

5 Claims, 4 Drawing Sheets

METHOD OF DEPOSITING GALLIUM NITRIDE ON A SUBSTRATE

CROSS-REFERENCE TO RELATED APPLICATION

The instant application claims priority to Malaysia Patent Application Serial No. PI 2018002272 filed Nov. 30, 2018, the entire specification of which is expressly incorporated herein by reference.

FIELD OF THE INVENTION

The present invention relates to a method of depositing a layer of gallium nitride on a substrate, and more particularly to a method of forming a high quality gallium nitride layer on a substrate that minimizes formation of defect such as threading dislocation.

BACKGROUND OF THE INVENTION

Gallium nitride (GaN) is a group III-V material that can be used in production of semiconductor power devices, including radio frequency (RF) components and light-emitting diodes. Particularly, GaN is commonly grown on c-plane (0002) direction for optoelectronics and power devices application, while silicon, sapphire and silicon carbide are some examples of the common substrate for deposition of GaN. On the other hand, wurtzite crystal structure that attributes to hardness and robustness in GaN, enables GaN to possess an exceptional crack resistance in its pure form, and allows its deposition in thin film on sapphire or silicon carbide.

Furthermore, wide band gap of 3.4 eV provides GaN with special properties for applications in optoelectronic, high-power and high-frequency devices, such as a violet laser diode, without a need of a nonlinear optical frequency-doubling. Improvement in performance of transistor and integrated circuit is made possible when GaN is used in the device. Some advantages of applying GaN in a device include lower conductance losses, lesser switching losses, lesser losses when charging and discharging devices, lesser power needed to drive a circuit, lower cost, and lesser space needed on a printed circuit board.

Choice of a substrate material is critical for obtaining an ideal GaN growth mechanism. Despite difference in lattice constant, GaN can be grown on substrates such as silica carbide, aluminium oxide and lithium aluminate. Most GaN-based devices are currently grown parallel to polar c-axis, but this results in increments of defects such as threading dislocation. Particularly, threading dislocation exists due to presence of imperfections in a growth process, where the dislocation extends from surface of a strained layer system, goes through the layer and penetrates the substrate or bends at the interface into a misfit dislocation.

There exists a need to provide a method of growing GaN on a substrate that prepares a perfect template for growing a top GaN layer on a substrate, and minimizes the threading dislocation. Particularly, the substrate is a cone-shaped patterned sapphire substrate, and the growth is performed using metal organic chemical vapour deposition.

SUMMARY OF THE INVENTION

One aspect of the invention is to provide a method of depositing a layer of gallium nitride on a substrate that provides increased number of effective nucleation point on the substrate to prompt coalescence.

Another aspect of the invention is to a method of depositing a layer of gallium nitride on a substrate that increases crystal growth rate and reduces crystal growth time.

Still, one aspect of the invention is to a method of depositing a layer of gallium nitride on a cone-shaped patterned sapphire substrate to obtain a gallium nitride-deposited substrate having zero threading dislocation defects.

Yet, one aspect of the invention is to provide a high stability cone-shaped patterned sapphire substrate deposited with gallium nitride that can be used for application in optoelectronics, especially for improvement of blue light-emitting diode.

At least one of the preceding objects is met, in whole or in part, in which the embodiment of the present invention describes a method of depositing a coating layer comprising gallium nitride on a substrate comprising the steps of: (a) providing the substrate having a plurality of side walls and valleys; (b) forming a first layer of gallium nitride deposited on the substrate, by reacting gaseous trimethylgallium and ammonia at a temperature ranging from 400 to 500° C., such that the first layer is formed on the side walls and the valleys; and (c) forming a second layer of gallium nitride deposited on top of the first layer, by reacting gaseous trimethylgallium and ammonia at a temperature ranging from 1000 to 1200° C., to obtain the coating layer comprising the first layer of gallium nitride and the second layer of gallium nitride at a thickness ranging from 3.0 to 4.5 μm.

In one preferred embodiment of the present invention, it is disclosed that the first layer of gallium nitride and the second layer of gallium nitride coalesces to form the coating layer.

In a preferred embodiment of the present invention, it is disclosed that steps (b) and (c) are conducted using a metalorganic chemical vapour deposition technique.

In another preferred embodiment of the present invention, it is disclosed that the substrate is a sapphire substrate.

Preferably, the substrate is a cone shape patterned sapphire substrate.

In another preferred embodiment of the present invention, it is disclosed that step (b) is conducted from 3 to 150 minutes.

Further embodiment of the present invention discloses that surface roughness of the coating layer is ranging from 0.15 to 0.25 nm.

One skilled in the art will readily appreciate that the present invention is well adapted to carry out the objects and obtain the ends and advantages mentioned, as well as those inherent therein. The embodiment described herein is not intended as limitations on the scope of the invention.

BRIEF DESCRIPTION OF THE DRAWINGS

For the purpose of facilitating an understanding of the invention, there is illustrated in the accompanying drawing the preferred embodiments from an inspection of which when considered in connection with the following description, the invention, its construction and operation and many of its advantages would be readily understood and appreciated.

DETAILED DESCRIPTION OF THE INVENTION

Figure 1:
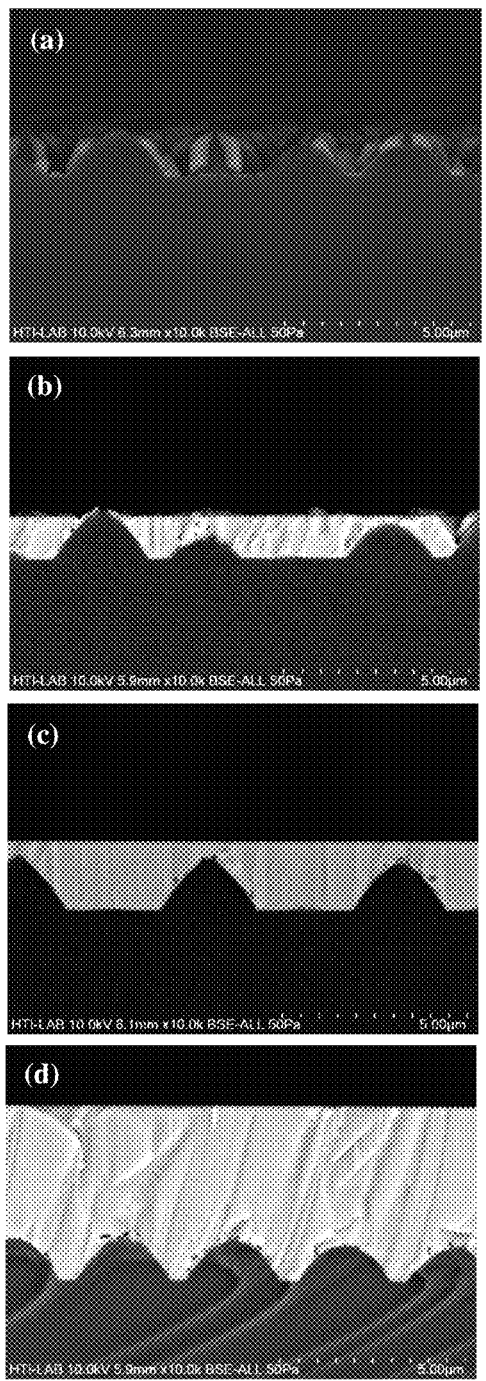
FIG. 1 shows cross-sectional scanning electron micrograph images of deposition of gallium nitride layer on a cone-shaped patterned sapphire substrate at various deposition durations, at (a) 3.2 minutes, (b) 16 minutes, (c) 32 minutes, and (d) 90 minutes.

Hereinafter, the invention shall be described according to the preferred embodiments of the present invention and by referring to the accompanying description and drawings. However, it is to be understood that limiting the description to the preferred embodiments of the invention is merely to facilitate discussion of the present invention and it is envisioned that those skilled in the art may devise various modifications without departing from the scope of the appended claim.

The present invention relates to a method of depositing a coating layer comprising gallium nitride on a substrate comprising the steps of: (a) providing the substrate having a plurality of side walls and valleys; (b) forming a first layer of gallium nitride deposited on the substrate, by reacting gaseous trimethylgallium and ammonia at a temperature ranging from 400 to 500° C., such that the first layer is formed on the side walls and the valleys; and (c) forming a second layer of gallium nitride deposited on top of the first layer, by reacting gaseous trimethylgallium and ammonia at a temperature ranging from 1000 to 1200° C., to obtain the coating layer comprising the first layer of gallium nitride and the second layer of gallium nitride at a thickness ranging from 3.0 to 4.5 µm. Particularly, steps (b) and (c) are conducted using a metalorganic chemical vapour technique.

According to one of the preferred embodiments of the present invention, the method comprises a step of providing the substrate having a plurality of side walls and valleys. Preferably, the substrate is a sapphire substrate. A cone shape patterned sapphire substrate is preferred, such that light extraction efficiency in a light-emitting diode (LED) comprising the substrate can be maximized. In addition, the cone-shaped surface is a strong diffuser, and is able to increase escape probability of trapped photons within the substrate. The substrate acts a template for gallium nitride deposition, particularly in a c-plane orientation, such that the substrate can be used for further application in optoelectronics. Preferably, the substrate is preheated at a temperature of 1125° C. under flow of hydrogen gas prior to deposition of gallium nitride.

According to another preferred embodiment of the present invention, the method comprises a step of forming the first layer of gallium nitride deposited on the substrate, by reacting gaseous trimethylgallium and ammonia at a temperature ranging from 400 to 500° C., and preferably at a temperature of 425° C. Particularly, the first layer is formed on the side walls and the valleys of the substrate. The step can be conducted from 3 to 150 minutes, where the duration of the step determines thickness of the first layer. The first layer regarded as low-temperature buffer layer, acts as a preliminary layer for providing a template for deposition of the second layer of gallium nitride. Preferably, the first layer is deposited at a thickness ranging between 20 to 50 nm.

According to a preferred embodiment of the present invention, the method comprises a step of forming the second layer comprising gallium nitride on top of the first layer. The step is carried out by reacting gaseous trimethylgallium and ammonia at a temperature ranging from 1000 to 1200° C., preferably at a temperature of 1100° C. Preferably, the step is conducted for a duration of 3 to 90 minutes, where the duration determines thickness of the second layer. More preferably, the step of forming the second layer is conducted for 90 minutes. At the end of the step, the second layer is coalesced with the first layer to form the coating layer having a thickness ranging from 3.0 to 4.5 µm.

Deposition of gallium nitride layer on the substrate set forth in step (c) is illustrated in FIG. 1. As shown in FIG. 1(a), gallium nitride is deposited directly on top of surface of the substrate, including surface of the side walls and the valleys, after a deposition duration of 3.2 minutes. The gallium nitride layer further covers the cone shaped structures of the substrate after a deposition duration of 16 minutes as shown in FIG. 1(b). The gallium nitride layer thickened along with the deposition duration, and illustrations as shown in FIGS. 1(c) and 1(d) are representing a deposition duration of 32 minutes and 90 minutes.

According to one preferred embodiment of the present invention, nucleation site of the first layer and the second layer coalesce to form the coating layer, where the coating layer is having a surface roughness ranging from 0.15 to 0.25 nm. Particularly, the range of surface roughness falls within an ideal surface roughness of 1 nm, and more particularly the coating layer has an abrupt cross-section, smooth terraces, sharp interfaces between the first and second layers. The nucleation site coalesces with minimal defect compensation on the coating layer.

Furthermore, the method is carried out in a reactor, preferably a horizontal reactor. At the end of the reaction, the coating layer comprising the first layer of gallium nitride and the second layer of gallium nitride forms a mirror-like and crack-free c-plane (0002) structure on the substrate.

The present disclosure includes as contained in the appended claims, as well as that of the foregoing description. Although this invention has been described in its preferred form with a degree of particularly, it is understood that the present disclosure of the preferred form has been made only by way of example and that numerous changes in the details of construction and the combination and arrangements of parts may be resorted to without departing from the scope of the invention.

EXAMPLES

The following non-limiting example has been carried out to illustrate the preferred embodiments of the invention.

Example 1

A 5.08-cm c-plane (0002) cone-shaped patterned sapphire substrate (CSPSS) was loaded in a horizontal three-layer laminar flow reactor (Taiyo Nippon Sanso SR-2000). Metal organic vapour deposition (MOCVD) technique was used to grow the layer structure. Firstly, the substrate was heated for 10 minutes at temperature of 1125° C. under ambient hydrogen gas, as shown in FIG. 1.

Growth of another set of CSPSS was carried out in a horizontal reactor using trimethylgallium (TMG), and flow of ammonia as precursor under atmospheric pressure. Hydrogen or nitrogen can be used as gas carrier. The low temperature GaN buffer layer (LTBL) was deposited at ramped down deposition temperature of 425° C. for 80 seconds. An equation of the reaction is as shown in Equation (1).

$$Ga(CH_3)_3 + NH_3 \rightarrow GaN + 3CH_4 \quad \text{Equation (1)}$$

Temperature of the reactor was increased to a desired temperature of 1100° C. for forming a high-temperature GaN (HT-GaN) layer on top of the LTBL, at various deposition time of 3.2, 16, 32 and 90 minutes to study mechanism of nucleation formation from basal to valley of the CSPSS. Accordingly, HT-GaN was formed using TMG, with hydrogen and ammonia based on Equation (2), (3) and (4).

$$Ga(CH_3)_3 + 3/2H_2 \rightarrow Ga + 3CH_4 \quad \text{Equation (2)}$$

$$NH_3 \rightarrow \tfrac{1}{2}N_2 + 3/2H_2 \quad \text{Equation (3)}$$

$$Ga + NH_3 \rightarrow GaN + 3/2H_2 \quad \text{Equation (4)}$$

GaN nucleation appears on both basal and cone surface of the CSPSS during initial growth stage at low temperature when forming LTBL. Particularly, growth of LTBL on the cone surface was dominant, where the LTBL forms an amorphous layer having thickness of approximately 10 to 50 nm. Particularly, the LTBL is able to transmit properties of the substrate to the upper GaN layer, by inducing growth in hexagonal islands with (0001) face and {10-11} face, and side angle ranging from 40 to 50° and in contrast to 90° direct growth. More particularly, the LTBL reduces interface energy and promotes lateral growth of GaN that coalesces with the islands. Upon complete coalesce of the islands, 2-dimensional growth of the GaN is initiated. As such, the deposited GaN experiences small difference in crystal plane that promotes lesser defect to the deposition layer to form a superior crystal quality. This indicates that the deposited GaN layer has higher stability on the cone surface. Furthermore, density of GaN on the nucleation site further increases in the HT-GaN layer. After 90 minutes of deposition, both the basal and the cone surface were successfully coalesced and formed a uniform and smooth GaN layer. Surface roughness of the GaN layer was validated by atomic force microscopy (AFM), and measured at 0.199 nm. Full width of half maximum (FWHM) value for (002) and (102) XRD phase analysis of the GaN layer were measured at 220 and 211 arcsec, respectively. Ability to produce high crystal quality GaN on a patterned sapphire substrate is beneficial for further enhancing optoelectronic characteristics. In addition, increasing growth rate of GaN nucleation on the cone surface reduces time required for growing the GaN layer.

Example 2

Figure 2:
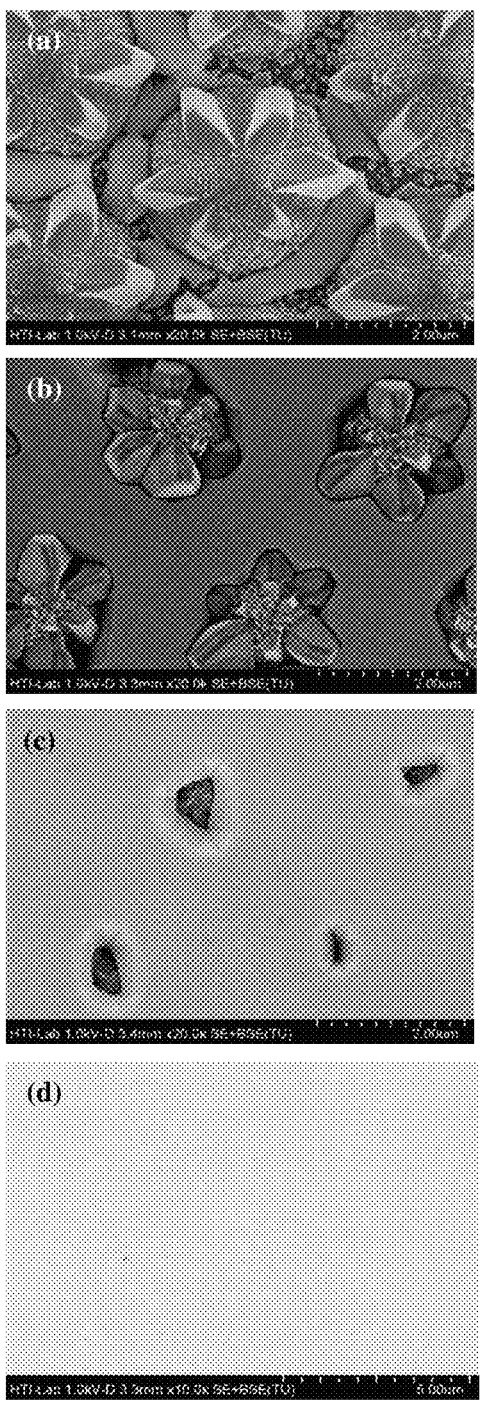
FIG. 2 shows a topography scanning electron micrograph images of deposition of gallium nitride layer on a cone-shaped patterned sapphire substrate at various deposition durations, at (a) 3.2 minutes, (b) 16 minutes, (c) 32 minutes, and (d) 90 minutes.
Figure 3:
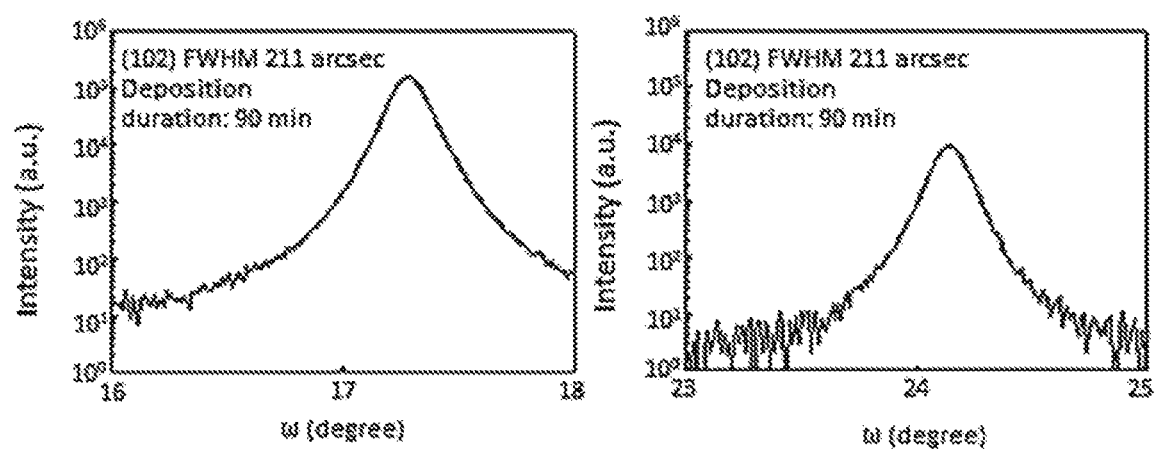
FIG. 3 is (a) (002) and (b) (102) phase analysis for 90 minutes deposited gallium nitride on a cone shaped patterned sapphire substrate.
Figure 4:
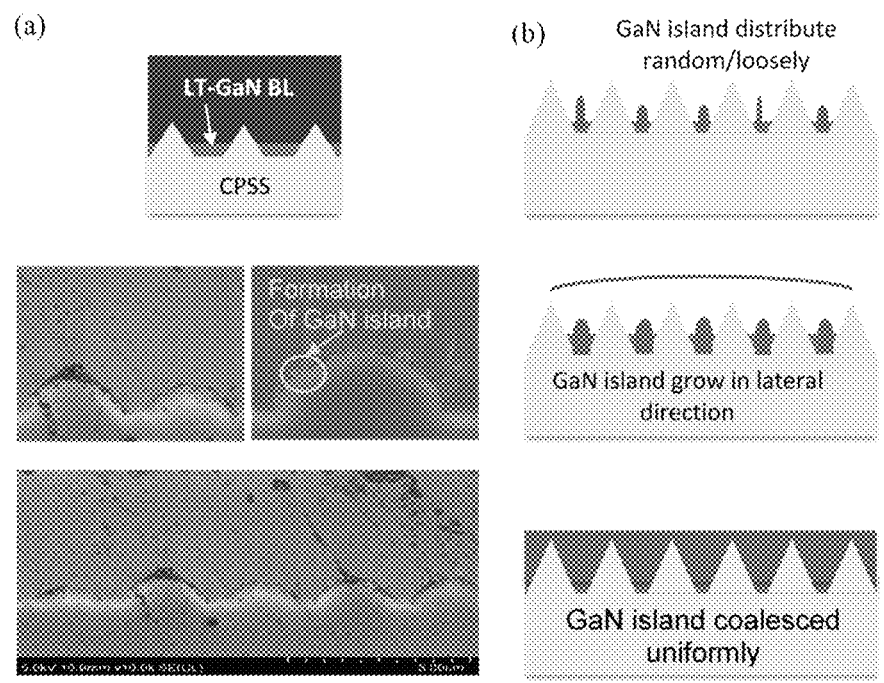
FIG. 4 shows (a) a cross-sectional scanning electron microscope images of low temperature buffer layer (LTBL)-gallium nitride (GaN) and high temperature GaN, and (b) growth mechanism of GaN island on a patterned sapphire substrate.

FIG. 4(a) shows formation of GaN islands at 1100° C. The hexagonal island is no longer observable on CSPSS, implying that GaN islands coalesce in a faster rate as compared to the patterned sapphire substrate (PSS). FIG. 2(a) showing the cross-sectional image indicates that morphologies of the samples attributed to the fully coalescence between LTBL and HT-GaN. This also indicates that GaN islands are exhibiting faster lateral growth rate in the CSPSS. The smoother surface morphology and shorter growth period in the CSPSS can be attributed to the nucleation formation.

On CSPSS, high-temperature GaN grains cover the patterns, where the patterns prevent GaN islands from merging and hence lead to loose distribution of islands in comparison to that of the non-PSS. It is to be noted that all GaN islands are growing between the ordered patterns and eventually covering the patterns simultaneously. This shortens the growth period and improves uniformity of surface morphology of the deposited GaN, the graphical illustration is as shown in FIG. 4(b).

As for the non-PSS, despite dense distribution of the GaN islands, the disordered arrangement significantly affects growth conditions of the GaN islands. Some of the islands are enlarged and gradually covering the smaller islands, while some of the enlarged islands merge during the growth. Such disordered growth modes lead to slow lateral growth rate and thereby the correspondingly producing a rough morphology.

What is claimed is:

1. A method of depositing a coating layer comprising gallium nitride on a cone-shaped patterned sapphire substrate, comprising the steps of:
    (a) providing the cone-shaped patterned sapphire substrate having a plurality of side walls and valleys;
    (b) forming a first layer of gallium nitride deposited on the cone-shaped patterned sapphire substrate, by reacting gaseous trimethylgallium and ammonia at a temperature ranging from 400 to 500° C., such that the first layer is formed on the side walls and the valleys; and
    (c) forming a second layer of gallium nitride deposited on top of the first layer, by reacting gaseous trimethylgallium and ammonia at a temperature ranging from 1000 to 1200° C., to obtain the coating layer comprising the first layer of gallium nitride and the second layer of gallium nitride at a thickness ranging from 3.0 to 4.5 μm.

2. The method according to claim 1, wherein the first layer of gallium nitride and the second layer of gallium nitride coalesces to form the coating layer.

3. The method according to claim 1, wherein steps (b) and (c) are conducted using a metalorganic chemical vapor deposition technique.

4. The method according to claim 1, wherein step (b) is conducted over a time range of 3 to 150 minutes.

5. The method according to claim 1, wherein a surface roughness of the coating layer ranges from 0.15 to 0.25 nm.

* * * * *